(12) United States Patent
Qureshi

(10) Patent No.: US 9,362,871 B2
(45) Date of Patent: Jun. 7, 2016

(54) WIDEBAND AMPLIFIER

(71) Applicant: Ampleon Netherlands B.V., Nijmegen (NL)

(72) Inventor: Jawad Hussain Qureshi, Gelderland (NL)

(73) Assignee: AMPLEON NETHERLANDS B.V., Nijmegen (NL)

( * ) Notice: Subject to any disclaimer, the term of this patent is extended or adjusted under 35 U.S.C. 154(b) by 0 days.

(21) Appl. No.: 14/444,106

(22) Filed: Jul. 28, 2014

(65) Prior Publication Data

US 2015/0061775 A1 Mar. 5, 2015

(30) Foreign Application Priority Data

Aug. 30, 2013 (EP) .................................... 13182458

(51) Int. Cl.
*H03F 3/21* (2006.01)
*H03F 3/193* (2006.01)
(Continued)

(52) U.S. Cl.
CPC ............. *H03F 3/211* (2013.01); *H01P 1/184* (2013.01); *H03F 1/0288* (2013.01); *H03F 1/56* (2013.01);
(Continued)

(58) Field of Classification Search
USPC .......................... 330/295, 124 R, 286, 53, 84
See application file for complete search history.

(56) References Cited

U.S. PATENT DOCUMENTS 7,961,048 B2 * 6/2011 Oakley .................. H03F 1/0288
                                                       330/124 R
8,441,326 B1   5/2013 Bromberger
(Continued)

FOREIGN PATENT DOCUMENTS

WO    2011/134635 A1    11/2011

OTHER PUBLICATIONS

Doherty, W.H.; "A new high efficiency power amplifier for modulated waves"; Proceedings of the Institute of Radio Engineers, vol. 24, No. 9; 20 pages (Sep. 1936).
(Continued)

*Primary Examiner* — Hieu Nguyen
(74) *Attorney, Agent, or Firm* — McDonnell Boehnen Hulbert & Berghoff LLP

(57) ABSTRACT

A Doherty amplifier is disclosed, being adapted to receive an RF input signal and to output an RF output signal and comprising a main amplifier and a peak amplifier, each comprising: a first amplifier (T1, T1') and a second amplifier (T2, T2'), each amplifier having a respective input terminal and a respective output terminal, the first amplifier and the second amplifier being adapted to amplify a respective input signal derived from the RF input signal and received at the respective input terminal and to deliver a first output signal and a second output signal, respectively; a first phase shifter (14, 14') and a second phase shifter (15, 15') coupled to the output terminal of the first amplifier and to the output terminal of the second amplifier, respectively; a third phase shifter (16, 16'); and a fourth phase shifter (17, 17'); wherein the Doherty amplifier further comprises a first combining node (A) and a second combining node (B) and, wherein each third phase shifter is coupled between the respective first phase shifter and the first combining node; each fourth phase shifter is coupled between the respective second phase shifter and the second combining node, and the third phase shifter of each of the main amplifier and the peak amplifier is adapted to be electrically coupled to the respective fourth phase shifter the output RF signal being obtained from a signal obtained in the first combining node and a signal obtained in the second combining node. An associated PCB is also disclosed.

13 Claims, 3 Drawing Sheets

(51) Int. Cl.
*H03F 3/68* (2006.01)
*H03F 1/02* (2006.01)
*H03F 1/56* (2006.01)
*H03F 3/45* (2006.01)
*H03F 3/60* (2006.01)
*H01P 1/18* (2006.01)
*H01P 5/18* (2006.01)

(52) U.S. Cl.
CPC ............ *H03F 3/193* (2013.01); *H03F 3/45183* (2013.01); *H03F 3/604* (2013.01); *H01P 5/187* (2013.01); *H03F 2200/09* (2013.01); *H03F 2200/192* (2013.01); *H03F 2200/198* (2013.01); *H03F 2200/204* (2013.01); *H03F 2200/423* (2013.01); *H03F 2200/451* (2013.01); *H03F 2203/21106* (2013.01); *H03F 2203/21139* (2013.01); *H03F 2203/21142* (2013.01); *H03F 2203/45481* (2013.01)

(56) References Cited

U.S. PATENT DOCUMENTS

2010/0148877 A1  6/2010  Okley et al.
2013/0027272 A1  1/2013  Karthaus

OTHER PUBLICATIONS

NXP Semiconductors; "Product data sheet, BLF888—UHF Power LDMOS Transistor—Rev. 5"; retrieved from the internet Jul. 21, 2014 http://www.nxp.com/documents/data_sheet/BLF888.pdf ; 17 pages (Jan. 21, 2011).

Mohamed, Ahmed M.M.M, et al; "Reconfigurable Doherty Power Amplifier for Multifrequency Wireless Radio Systems"; IEEE Trans. on Microwave Theory and Techn., vol. 61, No. 4; pp. 1588-1598 (Apr. 2013).

Extended European Search Report for application 13182458.3 (Feb. 18, 2014).

\* cited by examiner

WIDEBAND AMPLIFIER

CROSS-REFERENCE TO RELATED APPLICATIONS

This application claims the priority under 35 U.S.C. §119 of European patent application no. 13182458.3, filed on Aug. 30, 2013, the contents of which are incorporated by reference herein.

FIELD

The invention relates to wideband amplifiers and to a method of manufacturing such amplifiers.

BACKGROUND

Doherty amplifiers are used on a relatively large scale in modern base stations that are used in mobile communications. A variant of Doherty amplifier may be adapted to be used in wideband operation in broadcast applications. The structure of such a wideband Doherty amplifier is shown in FIG. 1. The amplifier comprises a signal splitter 1 adapted to split an input signal into two almost equal amplitude components. A first component is inputted into a phase shifter 2 and the resultant phase shifted signal in further inputted into a Main amplifier 3. A second component is inputted into a Peak amplifier 7. Typically, the phase shift is 90°. In normal operation, the Main amplifier 3 operates in class AB and the Peak amplifier operates in class C. The two components of the input signal are amplified by the two amplifiers and at the output of the Main and Peak amplifiers respective amplified signals are obtained. The amplified signals are each phase shifted by phase shifters 4, 5 and 6 and the resultant signals are combined at point K. The phase shifters are also used as impedance adapters for load impedance 8 which is coupled to the point K.

Additionally, the Doherty amplifier may comprise adaptation circuits coupled to the phase shifters 4,5 and 6. The adaptation circuits may be, for example, LC filters.

The Main and the Peak amplifiers may each be implemented as power amplifiers typically as a single transistor implemented in different materials and technologies, such as for instance LDMOS, CMOS, GaN and GaAs.

Usually, the Doherty amplifier is mounted on a Printed Circuit Board (PCB) either single sided or double sided. In the case of amplifiers designed for relatively high frequency signals i.e. in the range of hundreds of MHz or more, the phase shifters 2, 4, 5, 6 may be implemented as delay lines; that is to say, they may be implemented as simple copper strips on one side of the PCB. The whole system may then be attached to a power dissipation radiator or heatsink, for dissipating the heat generated by the transistors, thereby protecting them from overheating.

The physical size of conventional wideband Doherty implementations is relatively large, which results in relatively high costs associated with the mechanical design of the transmitter. For amplifiers that are required to deliver relatively high powers i.e. in range of hundreds of watts, very large transmission lines are necessary.

SUMMARY

According to embodiments there is provided a Doherty amplifier adapted to receive an RF input signal and to output an RF output signal and comprising a main amplifier and a peak amplifier, each comprising:

a first amplifier and a second amplifier, each amplifier having a respective input terminal and a respective output terminal, the first amplifier and the second amplifier being adapted to amplify a respective input signal derived from the RF input signal and received at the respective input terminal and to deliver a first output signal and a second output signal, respectively;

a first phase shifter and a second phase shifter coupled to the output terminal of the first amplifier and to the output terminal of the second amplifier, respectively;

a third phase shifter; and a fourth phase shifter;

wherein the Doherty amplifier further comprises a first combining node and a second combining node and, wherein each third phase shifter is coupled between the respective first phase shifter and the first combining node;

each fourth phase shifter is coupled between the respective second phase shifter and the second combining node, and the third phase shifter of each of the main amplifier and the peak amplifier is adapted to be electrically coupled to the respective fourth phase shifter, the output RF signal being obtained from a signal obtained in the first combining node and a signal obtained in the second combining node.

In this way it may be that some of the harmonics of the input signals are reduced and as a consequence either or both the linearity and the bandwidth of the amplifier may be improved.

According to embodiments, the first amplifier and the second amplifier each comprises a differential pair of transistors. The skilled person in the art would appreciate that said transistors may be obtained using different process technologies which may include without limitation bipolar, GaN, GaAs, LDMOS, etc.

According to embodiments, the respective electrical coupling between each third phase shifter and the respective fourth phase shifter is adapted to reduce a harmonic component which is present in each respective first output signal and second output signal. That component may be without limitation a second harmonic which is present in the first output signal and the second output signal.

In embodiments any of the first phase shifter, the second phase shifter, the third phase shifter and the fourth phase shifter is adapted to be implemented as a strip line. For Doherty amplifiers having operating frequencies in the frequency range of hundreds of MHz or more this may result in a relatively small footprint of the Doherty amplifier.

According to embodiments:

a sum of a phase shift of the first phase shifter and a phase shift of the third phase shifter of the first amplifier is substantially 90°;

a sum of a phase shift of the second phase shifter and a phase shift of the fourth phase shifter of the first amplifier is substantially 90°;

a sum of a phase shift of the first phase shifter and a phase shift of the third phase shifter of the second amplifier is substantially 180°; and a sum of a phase shift of the second phase shifter and a phase shift of the fourth phase shifter of the second amplifier is substantially 180°.

This particular configuration may result in the higher harmonics of the amplified input signal being substantially reduced allowing for an increased linearity and therefore an increased bandwidth.

In embodiments, the Doherty amplifier further comprises:
a first balun;
a first string of serially coupled transmission lines having a first end coupled to the first combining point and a second end coupled to a first terminal of the balun;
a second string of serially coupled transmission lines having a third end coupled to the second combining point and a fourth end coupled to a second terminal of the balun;
a third terminal of the balun being coupled to a load impedance;
a fourth terminal of the balun being coupled to a ground terminal; and wherein
each transmission line included in the first string of serially coupled transmission lines being adapted to be electrically coupled to a respective transmission line included in the second string of the serially coupled transmission lines.

The term balun used throughout this application is mainly interpreted as a circuitry adapted to at least one of transform a balanced signal into an unbalanced or single ended signal and the other way around. In general it may be considered to behave like an electrical transformer that is able to adapt a single ended or grounded signal to a differential or un-grounded signal.

The first balun may be used to adapt the impedance of the load impedance to the impedance of the first and second string of impedances to improve the power transfer to the impedance.

The first and the second string of transmission lines are adapted to preserve the rejection of the higher harmonics of the signal and to adapt an impedance between the first combining point and the second combining point to an impedance between the first and the second terminals of the balun.

In embodiments the Doherty amplifier further comprises a capacitor coupled to the first combining point and to the second combining point. The capacitor may be used for compensation of any additional phase shifts introduced by the phase shifters.

In another embodiment of the invention the Doherty amplifier further comprises
a second balun;
a third balun;
each balun comprising a respective input terminal and first and second output terminals, the input terminal of the second balun being adapted to receive an input signal, the input terminal of the third balun being adapted to receive a phase shifted version of the input signal, the first and the second output terminals of the second balun being coupled to the first amplifier, and the first and the second output terminals of the third balun being coupled to the second amplifier. These particular baluns are thus used for transforming an input single ended signal into a differential one such that the amplifier may be able to reject some of the higher harmonics, to some extent. Furthermore, the dynamic range of the amplifier may be increased.

In embodiments, the Doherty amplifier further comprises a signal splitter comprising an input splitter terminal, a first output splitter terminal and a second output splitter terminal, the first output splitter terminal being coupled to the second balun and the second output splitter terminal being coupled to the third balun.

In embodiments, one of the first output splitter terminal or the second output splitter terminal is coupled to a phase compensator, the phase compensator being further coupled to either the second balun input terminal, or to the third balun input terminal.

In this way the amplitude of the signals inputted in the first and the second amplifier may be made to be similar or almost equal to each other.

According to an aspect, there is presented a printed circuit board comprising a first copper covered surface, wherein at least a subset of the phase shifters and a subset of the transmission lines included in a Doherty amplifier as described above are implemented as strip lines in the first copper covered surface. The footprint of the amplifier may thus be reduced when compared with conventional implementations.

In embodiments, the printed circuit board may further comprise a second copper covered surface opposing the first copper covered surface, wherein:
the first copper covered surface is adapted to accommodate a first structure comprising the third phase shifters and the first string of serially coupled transmission lines, the first structure having a first shape, a first orientation and a first position;
the second copper covered surface is adapted to accommodate a second structure comprising the fourth phase shifters and the second string of serially coupled transmission lines, the second structure having a second shape, a second orientation and a second position; and
wherein the first structure is a mirrored version of the second structure.

Typically, a double sided PCB is made of a dielectric material having a thickness less than 1 mm and on each side or surface, copper films are provided. By placing the respective delay lines and the phase shifters, back-to-back in corresponding positions on each surface, that is to say, mirroring each other, one may obtain a tightly coupled delay line separated by the dielectric of the PCB. Even more, the whole area occupied by the delay lines and the phase shifters may be very much reduced, relative to a single sided configuration.

Preferably, the Doherty amplifier is implemented as a power module mounted on a PCB.

In embodiments, the Doherty amplifier is used in a base station.

According to another aspect, there is provided a method of manufacturing a Doherty amplifier comprising steps of:
providing a first transistor and a second transistor, each transistor having respective gate, drain and source terminals, the first transistor and the second transistor being adapted to amplify an input signal and to deliver a respective first output signal and second output signal;
providing a first phase shifter and a second phase shifter coupled to the first transistor drain and to the second transistor drain, respectively;
providing a third phase shifter coupled to the first phase shifter and to first combining point;
providing a fourth phase shifter coupled to the second phase shifter and to a second combining point;
the third phase shifter being adapted to be electrically coupled to the fourth phase shifter.

The method may further comprise steps of
providing a first balun;
providing a first string of serially coupled transmission lines having a first end coupled to the first combining point and a second end coupled to a first terminal of the balun;
providing a second string of serially coupled transmission lines having a third end coupled to the second combining point and a fourth end coupled to a second terminal of the balun;
providing a third terminal of the balun being coupled to a load impedance;

providing a fourth terminal of the balun (24) being coupled to a ground terminal; wherein each transmission line included in the first string of serially coupled transmission lines being adapted to be electrically coupled to a respective transmission line included in the second string of the serially coupled transmission lines.

In embodiments there is provided a method of manufacturing a printed circuit board comprising a first side and a second side opposite to the first side, the printed circuit board being adapted to accommodate a Doherty amplifier as claimed in any claims 1 to 8, the method comprising steps of providing the first side which is adapted to accommodate a first structure comprising the third phase shifters and the first string of serially coupled transmission lines (18, 20, 22), the first structure having a first shape, a first orientation and a first position;

providing the second side which is adapted to accommodate a second structure comprising the fourth phase shifters and the second string of serially coupled transmission lines, the second structure having a second shape, a second orientation and a second position;

wherein the first structure is a mirrored version of the second structure.

The invention is defined by the independent claims.

Throughout the present description, equal reference numbers used in different figures refer to same devices or features.

BRIEF DESCRIPTION OF THE DRAWINGS

The above and other advantages will be apparent from the exemplary description of the accompanying drawings in which.

DETAILED DESCRIPTION OF EMBODIMENTS

Figure 2:
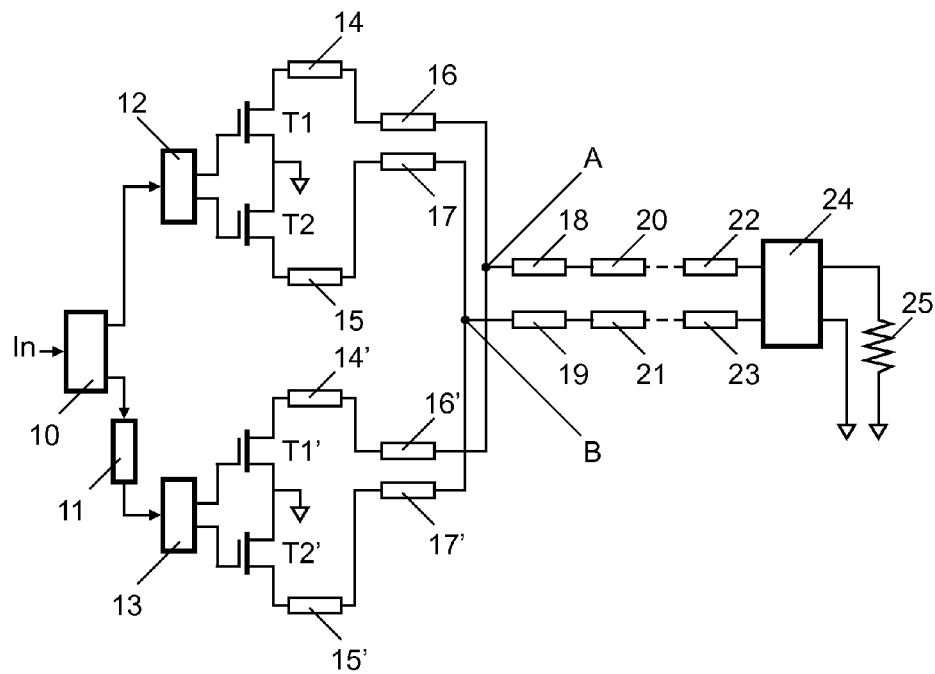
FIG. 2 depicts a Doherty amplifier according to embodiments.

FIG. 2 depicts a Doherty amplifier according to embodiments. The Doherty amplifier receives an input signal In in a splitter 10. The splitter generates two signals out of the input signal. The splitter may be a simple electrical node; in other embodiments, it may be, without limitation, a balun or a transformer. The skilled person will appreciate that a balun converts an unbalanced signal into two balanced signal (or vice versa), and in this context the input signal may be the unbalanced signal, and the two split signals are the balanced signal. In general terms, the role of the splitter is to divide the input signal into two signals, which may have similar or generally almost equal amplitudes. The two signals are inputted into respective further splitters, 12 and 13. The further splitters may typically be baluns, that is to say, a second balun 12 and a third balun 13. In embodiments a phase compensation circuit 11 may be provided, either between the splitter 10 and the second balun 12 or between the splitter 10 and the third balun 13. In other embodiments, such a phase compensation circuit may not be required. The baluns 12, 13 are used for transforming the single ended signals generated by the splitter 10 into ground-less signals which are input to respective first amplifier and second amplifiers. The first amplifier includes a first pair of transistors T1, T2, each transistor having a source terminal, a gate terminal and a drain terminal. The source terminals are connected together and further connected to the ground terminal of the whole circuit. The output terminals of the second balun 12 are separately coupled to the respective gates of the first pair of transistors T1, T2.

The second amplifier includes a second pair of transistors T1', T2', each transistor having a source terminal, a gate terminal and a drain terminal. The source terminals are connected together and further connected to the ground terminal of the whole circuit. The output terminals of the third balun 13 are separately coupled to the respective gates of the second pair of transistors T1', T2'.

The drains of each transistor of the first pair of transistors T1, T2 are coupled, respectively, to a first phase shifter 14 and to a second phase shifter 15. The skilled person will appreciate that the phase shifters may be implemented in any of several different forms, such as, without limitation, stripes on a printed circuit board, transmission lines and coaxial cables. The end of the first phase shifter 14 which is remote to the transistor T1 is coupled to a third phase shifter 16. The end of the phase shifter 15 which is remote from the transistor T2 is coupled to a fourth phase shifter 17.

The ends of phase shifters 16 and 17 which are remote from, respectively, phase shifters 14 and 15 are coupled to, respectively, a first combining point A and a second combining point B. The third phase shifter 16 and the fourth phase shifter 17 are tightly electrically coupled, that is to say, they are spatially located very close to each other, such that there is interference between the electrical signals in them.

Similarly, the drains of each transistor of the second pair of transistors T1', T2' are coupled to a first phase shifter 14' and to a second phase shifter 15'. The skilled person will appreciate that the phase shifters may be implemented in any of several different forms, such as, without limitation, stripes on a printed circuit board, transmission lines and coaxial cables.

The end of the first phase shifter 14' which is remote to the transistor T1' is coupled to a third phase shifter 16'. The end of the second phase shifter 15' which is remote from the transistor T2 is coupled to a fourth phase shifter 17'.

The ends of phase shifters 16' and 17' which are remote from, respectively, phase shifters 14' and 15' are coupled to, respectively, a first combining point A and a second combining point B. The third phase shifter 16' and the fourth phase shifter 17' are tightly electrically coupled, that is to say, they are spatially located very close to each other, such that there is interference between the electrical signals in them.

The first and third phase shifters 14 and 16 are configured such that, for a central design wavelength, the sum of the phase shift produced by the first phase shifter 14 and the phase shift produced by the third phase shifter 16 of the first amplifier is substantially 90°. A sum of a phase shift of the second phase shifter 15 and a phase shift of the fourth phase shifter 17 of the first amplifier is substantially 90°. In this context, in embodiments the term 'substantially 90°' means generally 90°±20° at the center frequency. Similarly, the first and third phase shifters of the second amplifier are configured such that, for the central design wavelength, the sum of the phase shift of the first phase shifter 14' and the phase shift of the third phase shifter 16' of the second amplifier is substantially 180°. A sum of a phase shift of the second phase shifter 15' and a phase shift of the fourth phase shifter 17' of the second amplifier is substantially 180°. In this context, in embodiments the term 'substantially 180°' means generally 180°±40° at the centre frequency. In other embodiments, it means 180°±5°.

Figure 4:
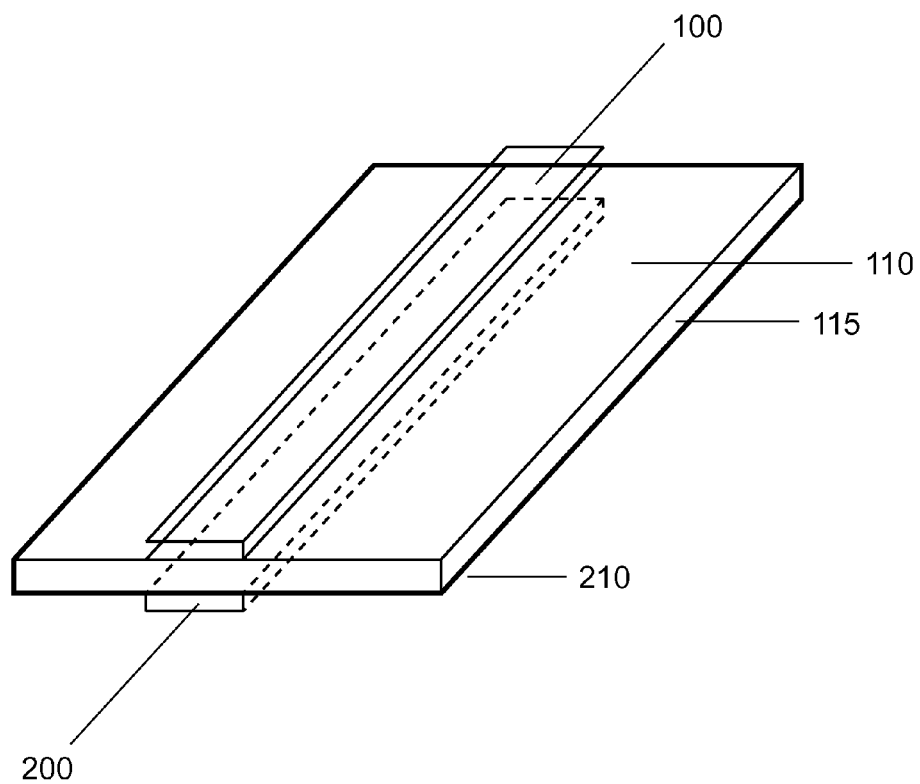
FIG. 4 depicts a printed circuit board according to embodiments.

It is appreciated that the third phase shifters 16, 17 and 16', 17', respectively are tightly electrically coupled. Placing the respective phase shifters in a closed position relative to each other would achieve the respective tight electrical coupling. When a Doherty amplifier is mounted on a Printed Circuit Board (PCB), the phase shifters may be implemented without limitation as copper strips. Recall that the PCBs may be single face or double faced, that is to say they have a face covered with a copper layer or they have both faces each covered with a copper layer. In FIG. 4 a double face PCB is depicted. It has a first face 110 and an opposite face 210. A dielectric 115 is located between the respective faces. The dielectric is relatively thin, that is to say less than 1 mm. On a face a first copper strip 100 may be formed. On the other face, a second strip 200 may be formed. The second strip 200 is a mirrored version of the first strip 100, that is to say, viewed through the PCB, the strips appear on top of each other. This configuration may allow for a tight coupling between the two copper stripes 100, 200. The above-mentioned structure is sometimes called broadside couplers. Such couplers may allow propagating through them only selected harmonics of a signal. This may be without limitation odd mode signals, that is to say signals having only odd harmonics. That means that even mode signals are blocked. Blocking either the even harmonics or the odd harmonics may result in, inter alia, an increased bandwidth of the amplifier. Of particularly interest might be blocking the even mode signals and even more particularly the second harmonic of the signal.

Coming back to FIG. 2, the Doherty amplifier further comprises a first balun 24. It further comprises a first string of serially coupled transmission lines 18, 20, 22, the string having a first end coupled to the first combining point A and a second end coupled to a first input terminal of the balun 24. The amplifier further includes a second string of serially coupled transmission lines 19, 21, 23 having a third end coupled to the second combining point B and a fourth end coupled to a second input terminal of the balun 24. A third terminal of the balun 24 is coupled to a load impedance 25. A fourth terminal of the balun 24 is coupled to a ground terminal. Each transmission line included in the first string of serially coupled transmission lines 18, 20, 22 is adapted to be electrically coupled to a respective transmission line included in the second string of the serially coupled transmission lines 19, 21, 23. It is appreciated that the transmission lines may be placed on the opposite sides of a PCB as it was explained above. However, other configurations are possible, including without limitation placing them only on one side of the PCB or implementing them using coaxial cables for example. The strings of the transmission lines provide an impedance adaptation between the balun 24 and the impedances presented at the first combining point A and the second combining point B, respectively such that the amplifiers enable enhanced or even a maximum power transmission. It may be observed that if a floating output load is considered then it may be coupled either directly to the respective combining nodes A and B, or between the third and the fourth terminal of the balun 24.

Small correction capacitors Cc1, Cc2 may be connected between the first combining point A and the second combining point B for correcting parasitic phase shifts that may influence the phase relationships presented above.

Figure 1:
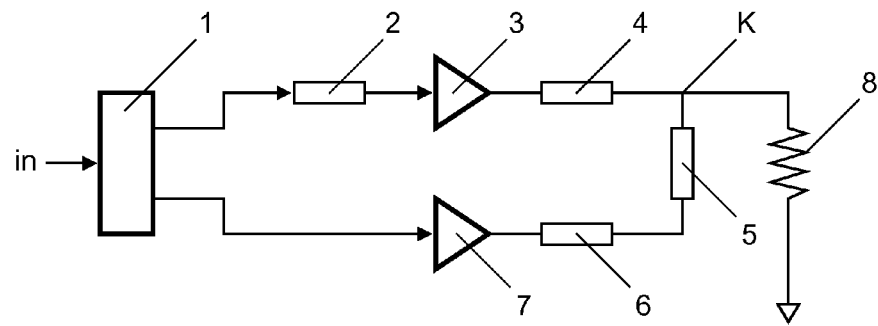
FIG. 1 depicts a wideband Doherty amplifier.
Figure 3:
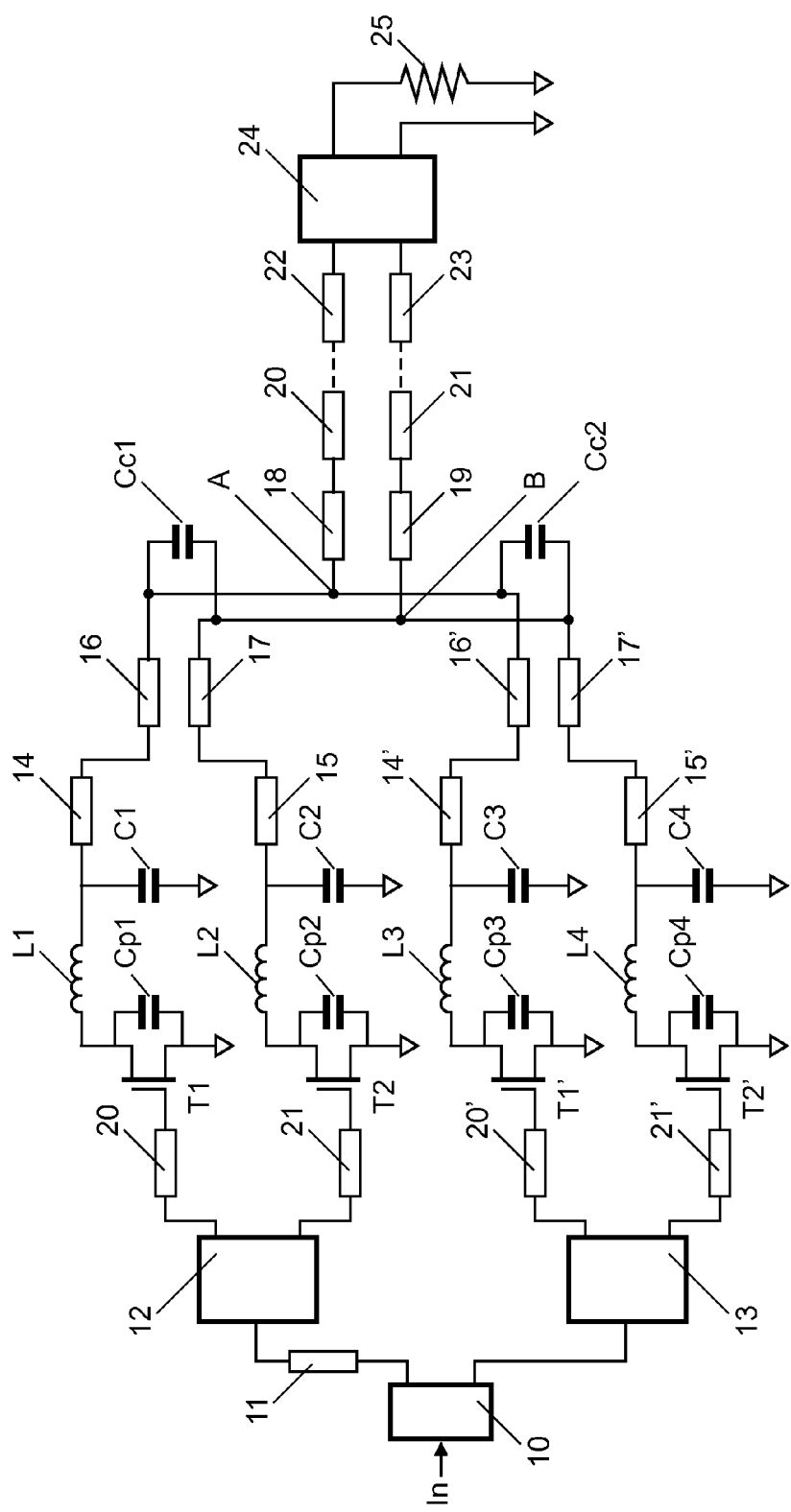
FIG. 3 depicts a more detailed Doherty amplifier according to embodiments.

FIG. 3 depicts a more detailed Doherty amplifier according to embodiments. In FIG. 3, equal reference numbers used in different FIGS. 1 and 2, refer to same devices or features.

The output terminals of the second balun 12 are separately coupled to the respective gates of the first pair of transistors T1, T2 via respective first additional transmission lines 20, 21. The first additional transmission lines are used for adapting the input impedance of each transistor in the first pair of transistors T1, T2.

The output terminals of the third balun 13 are separately coupled to the respective gates of the second pair of transistors T1', T2' via respective second additional transmission lines 20', 21'. The second additional transmission lines 20', 21' are used for adapting the input impedance of each transistor in the second pair of transistors T1', T2'.

Each transistor of the first and the second pair of transistor may present a respective parasitic capacitance Cp1, Cp2, Cp3, Cp4 between their respective drain and ground. A respective adaptation filter may be coupled to the respective drains of the transistors and the respective first and second phase shifters 14, 15, 14', 15'. The filters may be implemented as LC filters L1,C1; L2,C2; L3,C3; L4,C4.

In this document, relational terms such as first and second, top and bottom, and the like may be used solely to distinguish one entity or action from another entity or action without necessarily requiring or implying any actual such relationship or order between such entities or actions. It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A Doherty amplifier, comprising:
an RF signal input;
an RF signal output;
a main amplifier portion and a peak amplifier portion,
wherein the main and peak amplifiers portions each include:
a first amplifier;
a second amplifier,
a first phase shifter;
a second phase shifter;
a third phase shifter;
a fourth phase shifter;
wherein the first and second amplifiers each include an input terminal coupled to the RF signal input and an output terminal,
wherein within each of the portions,
the first phase shifter is coupled to the output terminal of the first amplifier
the second phase shifter is coupled to the output terminal of the second amplifier;
the third phase shifter is coupled to the first phase shifter; and
the fourth phase shifter coupled to the second phase shifter;
wherein the Doherty amplifier further comprises a first combining node and a second combining node,
wherein each portion's third phase shifter is coupled to the first combining node;
wherein each portion's fourth phase shifter is coupled to the second combining node, and
wherein the RF signal output is coupled to the first combining node and the second combining node.

2. A Doherty amplifier as claimed in claim 1, wherein the first amplifier and the second amplifier each comprises a differential pair of transistors.

3. A Doherty amplifier as claimed in claim 1, wherein each portion's third phase shifter is electrically coupled to each portion's fourth phase shifter; and wherein the electrical coupling between each third phase shifter and the respective fourth phase shifter is adapted to reduce a harmonic component on the output terminals of the first and second amplifiers.

4. A Doherty amplifier as claimed in claim 1,
wherein any of the first phase shifter, the second phase shifter, the third phase shifter and the fourth phase shifter is adapted to be implemented as a strip line.

5. A Doherty amplifier as claimed in claim 1, wherein
a sum of a phase shift of the first phase shifter and a phase shift of the third phase shifter of the first amplifier is substantially 90°;
a sum of a phase shift of the second phase shifter and a phase shift of the fourth phase shifter of the first amplifier is substantially 90°;
a sum of a phase shift of the first phase shifter and a phase shift of the third phase shifter of the second amplifier is substantially 180°; and
a sum of a phase shift of the second phase shifter and a phase shift of the fourth phase shifter of the second amplifier is substantially 180°.

6. A Doherty amplifier as claimed in claim 1 further comprising:
a first balun;
a first string of serially coupled transmission lines having a first end coupled to the first combining point and a second end coupled to a first terminal of the balun;
a second string of serially coupled transmission lines having a third end coupled to the second combining point and a fourth end coupled to a second terminal of the balun;
a third terminal of the balun configured to be coupled to a load impedance;
a fourth terminal of the balun configured to be coupled to a ground terminal; and wherein
each transmission line included in the first string of serially coupled transmission lines is adapted to be electrically coupled to a respective transmission line included in the second string of the serially coupled transmission lines.

7. A Doherty amplifier as claimed in claim 1 further comprising a capacitor coupled to the first combining point and to the second combining point.

8. A Doherty amplifier as claimed in claim 1 further comprising
a second balun;
a third balun;
each of the second and third balun comprising a respective input terminal and first and second output terminals,
the input terminal of the second balun adapted to receive an RF input signal on the RF signal input, the input terminal of the third balun adapted to receive a phase shifted version of the RF input signal, the first and the second output terminal of the second balun coupled to the respective input terminals of the first amplifier and the second amplifier included in the main amplifier, and the first and the second output terminal of the third balun coupled to the respective input terminals of the first amplifier and the second amplifier included in the peak amplifier.

9. A Doherty amplifier as claimed in claim 8, further comprising
a signal splitter comprising a splitter input terminal, a first splitter output terminal and a second splitter output terminal,
the first splitter output terminal coupled to the input terminal of the second balun and the second splitter output terminal coupled to the input terminal of the third balun.

10. A Doherty amplifier as claimed in claim 9,
wherein one of the first splitter output terminal or the second splitter output terminal is coupled to a phase compensator,
the phase compensator coupled to either the input terminal of the second balun, or to the input terminal of the third balun.

11. A printed circuit board comprising
a first copper covered surface,
wherein at least a subset of the phase shifters and a subset of the transmission lines included in a Doherty amplifier as claimed in claim 1 are implemented as strip lines in the first copper covered surface.

12. A printed circuit board as claimed in claim 11 further comprising
a second copper covered surface opposing the first copper covered surface, wherein:
the first copper covered surface is adapted to accommodate a first structure comprising the third phase shifters and the first string of serially coupled transmission lines, the first structure having a first shape, a first orientation and a first position;
the second copper covered surface is adapted to accommodate a second structure comprising the fourth phase shifters and the second string of serially coupled transmission lines, the second structure having a second shape, a second orientation and a second position; and
wherein the first structure is a mirrored version of the second structure.

13. A power module comprising a Doherty amplifier mounted on a printed circuit board as claimed in claim 11.

* * * * *